(12) United States Patent
Katoh

(10) Patent No.: US 6,288,578 B1
(45) Date of Patent: Sep. 11, 2001

(54) SIGNAL PROCESSOR FOR CHARGE COUPLED DEVICE

(75) Inventor: Satoshi Katoh, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/431,173

(22) Filed: Nov. 1, 1999

(30) Foreign Application Priority Data

Oct. 30, 1998 (JP) ................................................. 10-309583

(51) Int. Cl.[7] ................................................. H03K 17/00
(52) U.S. Cl. .............................. 327/94; 327/276; 327/284
(58) Field of Search ................................... 327/271, 276, 327/278, 264, 268, 283, 284, 285, 91, 94

(56) References Cited

U.S. PATENT DOCUMENTS

| | | | |
|---|---|---|---|
| 4,894,791 | * | 1/1990 | Jiang ...................................... 327/276 |
| 5,416,436 | * | 5/1995 | Rainard .................................. 327/272 |
| 5,942,937 | * | 8/1999 | Bell ......................................... 327/271 |
| 5,977,809 | * | 11/1999 | Wang et al. ............................ 327/259 |

FOREIGN PATENT DOCUMENTS

| | | | |
|---|---|---|---|
| 361237512 | * | 10/1986 | (JP) ...................................... 327/277 |
| 1-208975 | | 8/1989 | (JP) . |
| 3-80679 | | 4/1991 | (JP) . |
| 3-120978 | | 5/1991 | (JP) . |
| 4-43775 | | 2/1992 | (JP) . |
| 4-339477 | | 11/1992 | (JP) . |
| 404340807 | * | 11/1992 | (JP) ...................................... 327/261 |
| 8-317290 | | 11/1996 | (JP) . |

* cited by examiner

Primary Examiner—Timothy P. Callahan
Assistant Examiner—An T. Luu
(74) Attorney, Agent, or Firm—Young & Thompson

(57) ABSTRACT

A signal processor connected to a charge-coupled device includes a plurality of delay lines with different delay times connected to a node on a signal line extending from the charge-coupled device to an output terminal of the signal processor, and a selector connected to the plurality of delay lines for selecting an optimum one of the plurality of delay lines. As a result, an effective signal time period of a time delay-free signal inputted into an input terminal of a selected one of the delay lines is superimposed with a field through time period of a delayed signal reciprocally transmitted through the selected one of the delay lines and returned to the input terminal of the selected one of the delay lines.

5 Claims, 7 Drawing Sheets

SIGNAL PROCESSOR FOR CHARGE COUPLED DEVICE

BACKGROUND OF THE INVENTION

The present invention relates to a signal processor for a charge coupled device, and more particularly to a signal processor for a charge coupled device, wherein the signal processor has a noise canceller circuit for canceling noises of the charge coupled device.

The charge coupled device has been decreasing in size and has been improved to realize multiple pixels. Almost 100% of the image pick-up devices for television cameras are charge coupled devices. Diffusion and improvement in characteristics of electronic still camera have rendered development of the charge coupled device for the electronic still camera with one million pixels. The developments for the electronic still camera have focused on the multiple pixels and size reduction. The development to the electronic still camera for realizing the multiple pixels has caused a size reduction in each pixel. This reduction in size of the multiple pixel causes a problem with a reduction in quantity of signal charge. This reduction in quantity of signal charge causes reductions in sensitivity and dynamic range. In order to obtain sufficiently high sensitivity and dynamic range, a further noise reduction of the charge coupled device is essential, For realizing the noise reduction of the charge coupled device, various types of noise cancellation circuits have been proposed. One type of the noise cancellation circuits is a reflective delay-difference noise cancellation circuit is disclosed in Japanese patent No. 2522068, Japanese laid-open patent publication No. 1-208975, Japanese laid-open patent publication No. 3-80679, Japanese laid-open patent publication No. 4-43775, and Japanese laid-open patent publication No. 4-339477, wherein a difference between a field through level and an effective signal level is found by utilizing the reflection on a delay line so as to extract the effective signal via a switching circuit. This reflective delay-difference noise cancellation circuit is advantageous in relatively stable high speed performance and less returning of a high frequency band noise to a low frequency band noise. This circuit configuration is most effective for suppression of the noise.

FIG. 1 is a circuit diagram illustrative of the conventional reflective delay-difference noise cancellation circuit disclosed in Japanese patent No. 2522068.

The first noise cancellation circuit has a first buffer circuit 2 which has an input terminal connected to an output terminal of a charge coupled device image pick-up device 1. The first noise cancellation circuit has a first resistance 11 which is connected to an output side of the first buffer 2. The first noise cancellation circuit also has a second buffer circuit 7 which has an input terminal connected through the first resistance to the output terminal of the first buffer 2. The first noise cancellation circuit also has a delay line 13 which is connected between a ground line and a first node N1 between the first resistance 11 and the second buffer circuit 7. The first noise cancellation circuit also has a second resistance 12 which is connected to an output terminal of the second buffer circuit 7. The first noise cancellation circuit also has a first switch 9 which is connected through the second resistance 12 to the output terminal of the second buffer circuit 7. The first switch 9 is also connected between the second resistance and a second node N2. The first noise cancellation circuit also has a first capacitance 10 which is connected between the second node N2 and the ground line. The first resistance 11 has the same resistance as a specific impedance of the delay line 13. The delay line 13 has an output terminal which is grounded. An output signal from the charge coupled device image pick-up device 1 is transmitted through the first buffer circuit 2 and the first resistance 11 to the delay line 13. The signal is further transmitted from the delay line 13 to the second buffer circuit 7 and the second resistance 12 to the first switch 9 which is connected to the capacitance 10 as a hold capacitor.

FIG. 2 is a diagram illustrative of a time chart for operations of the first conventional circuit of FIG. 1. The output signal waveform is cyclic. One cycle for each pixel of the output signal from the charge coupled device may be classified or divided into three time periods. The first time period is a reset time period (a). The second time period is a field through time period (b). The third time period is a signal time period (c). An effective signal voltage level for one pixel appears to be potential differences Vs1, Vs2 and Vs3 between the field through time period (b) and the signal time period (c). The output signal (A) from the first buffer circuit 2 is transmitted through the first resistance 11 to the delay line 13, wherein the output signal (A) reaches the grounded output terminal with a time delay τ and inverted and reflected at the grounded output terminal, and then the delay signal reaches to the input terminal with the time delay τ. A total delay time of the delayed signal (B) is 2 τ. This total delay time 2 τ is set so that the signal time period of the output signal (A) is superimposed over the field through time period of the delayed signal (B), 10 whereby the output signal (A) transmitted through the first resistance 11 is mixed at the input terminal of the delay line 13 with the delayed signal (B) transmitted through the delay line 13. The mixture of the output signal (A) with the delayed signal (B) makes an output signal (C). The output signal (C) is then transmitted through the second buffer circuit 7 and the second resistance 12. For the output signal (C), the effective signal voltage is subjected to amplification-modulation and is represented to be the potential differences Vs1', Vs2' and Vs3'.

A sample pulse signal (D) is applied to the switch circuit 9 so that only the effective signal voltage Vs1', Vs2' and Vs3' pass through the switch 9. The foregoing processes provides that the effective signal voltage which corresponds to the potential difference between the field through time period and the signal time period is subjected to a sampling with elimination of a noise component which has been superimposed in the field through time period and the signal time period.

FIG. 3 is a block diagram illustrative of a noise cancellation circuit for the charge coupled device disclosed in Japanese laid-open patent publication No. 4-43775. The second noise cancellation circuit has a level shift resistor 102 which is connected to an image pick-up region 101. The second noise cancellation circuit also has an output circuit 103 which is connected to the level shift resistor 102. The second noise cancellation circuit also has a buffer circuit 104 which is connected to an output terminal of the output circuit 103. The second noise cancellation circuit also has a resistance 105 which is connected to an output terminal of the buffer circuit 104. The resistance 105 is thus connected between the output terminal of the buffer circuit 104 and a node N1. The second noise cancellation circuit also has a delay line 108 which is connected to the node N1 and also connected to a ground line. The second noise cancellation circuit also has a switch 109 which has a first terminal connected to the output side of the delay line 108, a second terminal connected directly to the ground line and a third terminal connected through a resistance 111 to the ground line. The switching operation of the switch 109 selects one of first and second states. In the first state, the first terminal and the second terminal are connected to each other so that the output signal from the delay line 108 is transmitted through the switch 109 to the ground line the output from the delay line 108 to be transmitted to the ground line or transmitted through the switch 109. In the second state, the first terminal and the third terminal are connected to each other so that the output signal from the delay line 108 is transmitted through the switch 109 and the resistance 111 to the ground line. The resistances 105 and 111 have an impedance equal to a specific impedance of the delay line 108. The second noise cancellation circuit also has a buffer circuit 106 which has an input terminal connected to the first node N1. The input terminal of the delay line 108 is thus connected through the node N1 to both the resistance 105 and the input terminal of the buffer circuit 106. The second noise cancellation circuit also has a buffer circuit 110 which has an input terminal connected to the third terminal of the switch 109 and also connected to the resistance 111. The second noise cancellation circuit also has a differential amplifier 107 which has a positive (non-inverted) input terminal which is connected to an output terminal of the buffer circuit 106 and a negative (inverted) input terminal which is connected to an output terminal of the buffer circuit 110. The second noise cancellation circuit also has a sampling circuit 112 which is connected to an output terminal of the differential amplifier 107 for receiving an output signal from the differential amplifier 107 so that only an effective signal voltage included in the output signal is subjected to the sampling process by the sampling circuit 112. The second noise cancellation circuit also has a pulse signal generator 113 which is connected to the sampling circuit 112 for supplying a pulse signal to the sampling circuit 112.

The following descriptions will focus on operations of the circuit of FIG. 3 at a first driving frequency. The output terminal of the delay line 108 is grounded through the switch 109. An output signal S1 from the buffer circuit 104 is inputted into the delay line 108. The inputted signal is delayed with a delay time "τ" to reach the output terminal of the delay line 108. Since the output terminal of the delay line 108 is grounded through the switch 109, the delayed signal is totally reflected The reflected signal is further transmitted on the delay line and delayed with the delay time "τ" to return the input terminal of the delay line 108. A total delay time of the delayed signal S2 is time 2 τ. The total delay time "2 τ" is set so that the effective signal time period of the input signal S1 is superimposed over the field through time period of the delayed signal S2. The input signal S1 is mixed at the input terminal of the delay line 108 with the delayed signal S2 thereby to generate an output signal S3 which is outputted from the delay line 108. The output signal S3 is transmitted through the buffer circuit 106 to the positive (non-inverted) input terminal of the differential amplifier 107. The negative (inverted) input terminal of the differential amplifier 107 is grounded to have a ground level. The differential amplifier 107 outputs only the effective signal voltage as an output signal S5. This output signal S5 consisting of only the effective signal voltage is transmitted into the sampling circuit 112 for enabling the sampling circuit 112 to sample the effective signal voltage.

Subsequently, the operations of the circuit of FIG. 3 with a second driving frequency which is two times of the above first driving frequency will be described hereinafter.

In this case, the switch 109 is in the second state where the first terminal and the third terminal are connected to each other, so that the output terminal of the delay line 108 is connected through the switch circuit 109 to the resistance 111 which has an impedance equal to the specific impedance of the delay line 108, for which reason no reflection of the signal with the delay time "τ" is caused, and thus no reflected delay signal returns to the input terminal of the delay line 108. Accordingly, the signal S1 from the charge coupled device is never mixed with any delayed signal. The signal S1 is transmitted through the buffer circuit 106 to the positive (non-inverted) input terminal of the differential amplifier 107. The delay signal S4 with the delay time "τ" is thus transmitted through the switch 109 and the buffer circuit 110 to the negative (inverted) input terminal of the differential amplifier 107. Since the one pixel time period of the charge coupled device is one half of that described above, the field through time period of the signal S4 inputted into the negative (inverted) input terminal of the differential amplifier 107 with the delay time, "τ" is superimposed over the effective signal time period of the signal S3. The differential amplifier 107 operates to take the difference between the signals S3 and S4 and then outputs an output signal S5. The output signal S5 is then transmitted to the sampling circuit 112 where the sampling circuit 112 operates to subjects the output signal S5 to the sampling operation whereby the effective signal voltage can be obtained. By utilizing the first driving frequency and the second driving frequency having the frequency higher by two times than the first driving frequency, the potential difference of the output signal from the charge-coupled device between the through field time period and the effective signal time period.

The above first and second conventional noise cancellation circuit have the following problems.

The first problem with the conventional noise cancellation circuit is that it is necessary to adjust delay time by changing the delay line in response to the driving frequency every time when the driving frequency is changed. The driving frequency change causes variation in length of both the field through time period and the effective signal time period, for which reason the delay time of the delay line is so adjusted that the effective signal time period is superimposed over the field through time period of the signal reflected by the output end of the delay line and returned to the input terminal of the delay line.

The second problem with the conventional noise cancellation circuit is that the circuit is responsive to but only two driving frequencies and not responsive to any other driving frequency. The switch is used to switch the output terminal of the delay line to be grounded or not grounded so that the delay time of the signal transmitted through the delay line is changed, for which reason only two driving frequencies, for example, a predetermined driving frequency and a two times higher driving frequency.

In the above circumstances, it had been required to develop a novel signal processing circuit for a charge coupled device, which is capable of changing a delay time of a delay line in response to variation in driving frequency or a plurality of driving frequencies.

Namely, it had been required to develop a novel signal processing circuit for a charge coupled device, free from the above problems.

SUMMARY OF THE INVENTION

Accordingly, it is an object of the present invention to provide a novel signal processing circuit for a charge coupled device free from the above problems.

It is a further object of the present invention to provide a novel signal processing circuit for a charge coupled device, which is capable of changing a delay time of a delay line in response to variation in driving frequency or a plurality of driving frequencies.

The present invention provides a signal processor connected to a charge-coupled device. The signal processor has: a plurality of delay lines being connected to a node on a signal line extending from the charge-coupled device to an output terminal of the signal processor, the delay lines having individually different delay times; and a selector being connected to the plurality of delay lines for selecting an optimum one of the plurality of delay lines, so that an effective signal time period of a time delay free inputted signal into an input terminal of a selected one of the delay lines is superimposed with a field through time period of a delayed signal reciprocally transmitted through the selected one of the delay lines and returned to the input terminal of the selected one of the delay lines.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1:
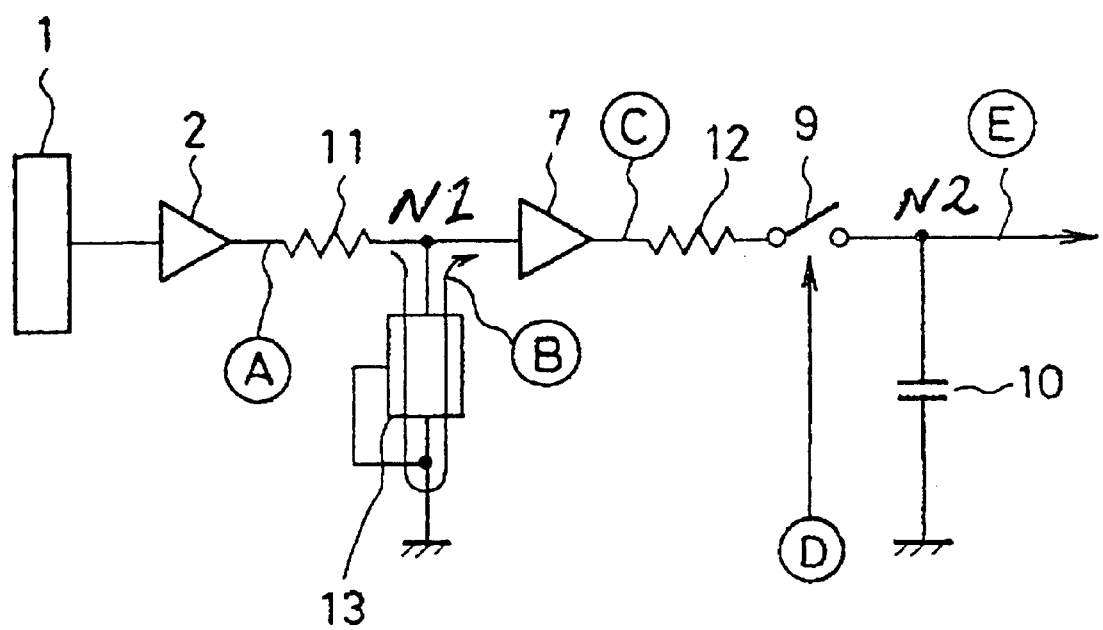
FIG. 1 is a circuit diagram illustrative of the conventional reflective delay-difference noise cancellation circuit disclosed in Japanese patent No. 2522068.
Figure 2:
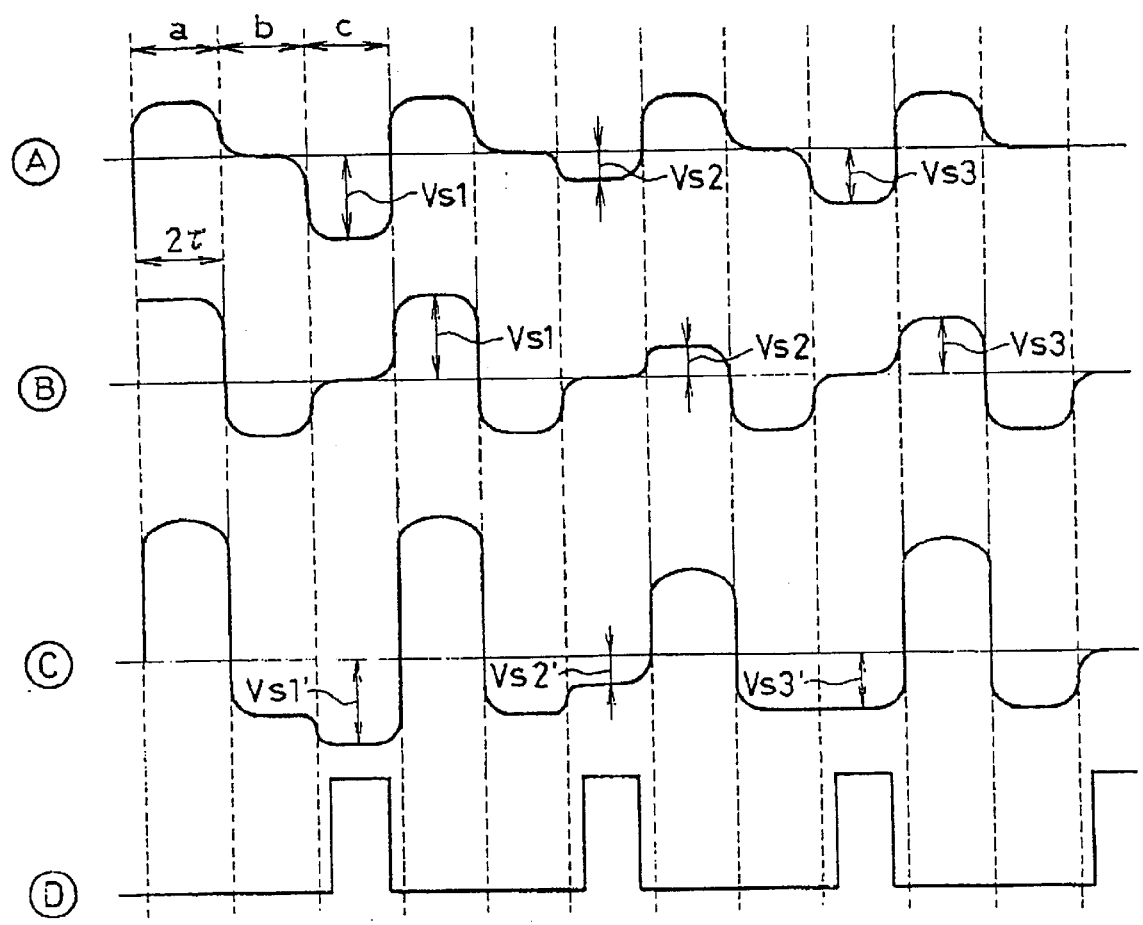
FIG. 2 is a diagram illustrative of a time chart for operations of the first conventional circuit of FIG. 1.
Figure 3:
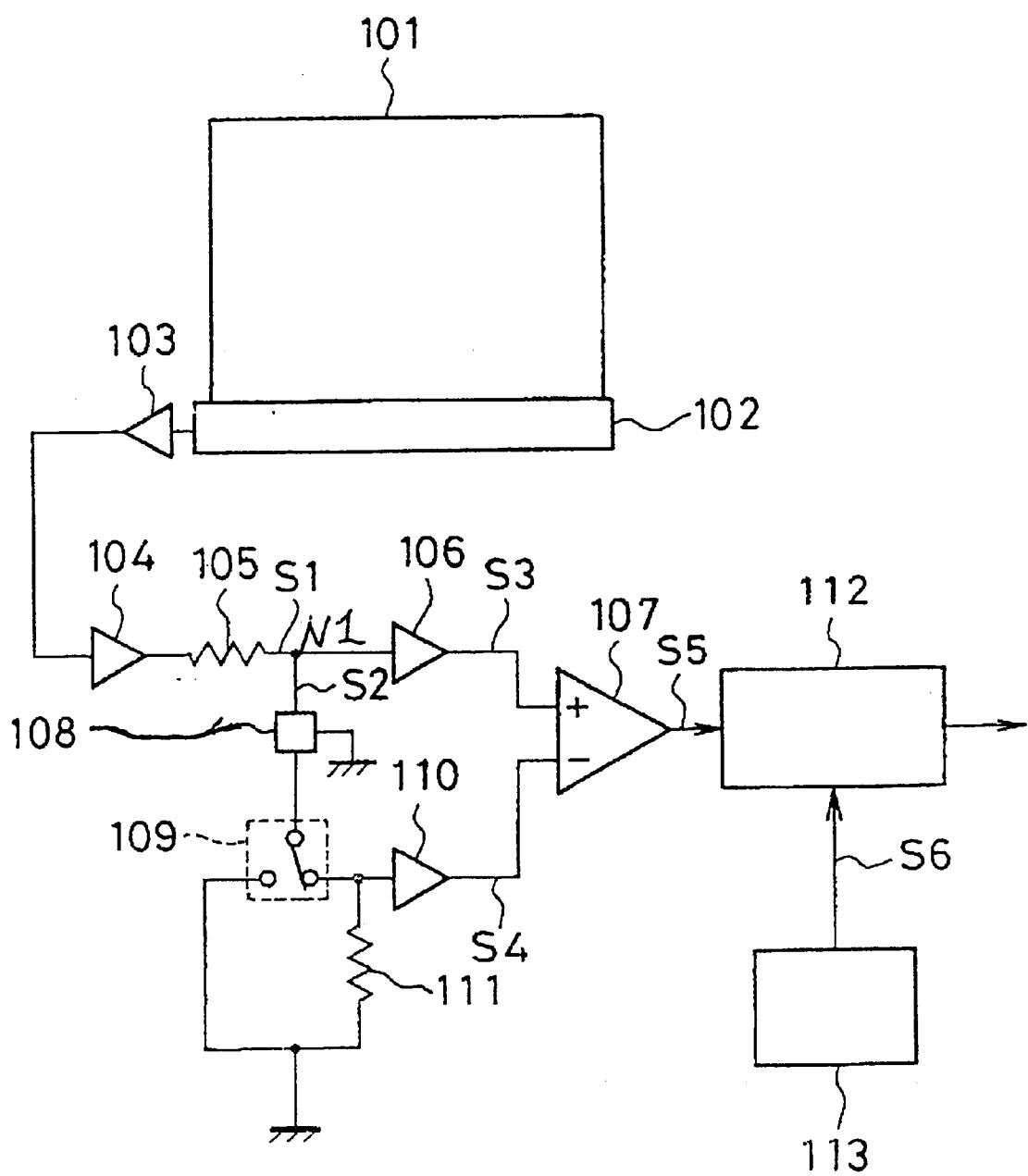
FIG. 3 is a block diagram illustrative of a noise cancellation circuit for the charge coupled device disclosed in Japanese laid-open patent publication No. 4-43775.

The first aspect of the present invention provides a signal processor connected to a charge-coupled device. The signal processor has: a plurality of delay lines connected to a node on a signal line extending from the charge-coupled device to an output terminal of the signal processor, the delay lines having individually different delay times; and a selector connected to the plurality of delay lines for selecting an optimum one of the plurality of delay lines, so that an effective signal time period of a time delay free inputted signal into an input terminal of a selected one of the delay lines is superimposed with a field through time period of a delayed signal reciprocally transmitted through the selected one of the delay lines and returned to the input terminal of the selected one of the delay lines.

It is unnecessary to replace the delay line every time when the driving frequency is changed, because the switching circuit is provided to select an optimum one of the plural delay lines having individually different delay times so that an effective signal time period of the inputted signal without delay time into the input terminal of the selected delay line is superimposed with a field through time period of the delayed signal reciprocally transmitted through the selected delay line and returned to the input terminal of the selected delay line.

It is preferable that the selector is connected between the plurality of delay lines and the node.

It is also preferable that the selector is connected between the plurality of delay lines and a ground line.

It is preferable to further comprise a signal generator connected to the charge-coupled device for generating both one of plural driving frequencies to be transmitted to the charge-coupled device and a selecting control signal to be transmitted to the selector, so that the selector is operated to select an optimum one of the plurality of delay lines in accordance with the received selecting control signal.

It is also preferable that the selector comprises a switching circuit.

The second aspect of the present invention provides a signal processor connected to a charge-coupled device. The signal processor has: a signal generator connected to the charge-coupled device for generating both one of plural driving frequencies to be transmitted to the charge-coupled device and a selecting control signal; a plurality of delay lines connected to a node on a signal line extending from the charge-coupled device to an output terminal of the signal processor, the delay lines having individually different delay times; and a selector connected to the plurality of delay lines and also connected to the signal generator for receiving the selecting control signal as so as to select an optimum one of the plurality of delay lines in accordance with the received selecting control signal, so that an effective signal time period of a time delay free inputted signal into an input terminal of a selected one of the delay lines is superimposed with a field through time period of a delayed signal reciprocally transmitted through the selected one of the delay lines and returned to the input terminal of the selected one of the delay lines.

It is unnecessary to replace the delay line every time when the driving frequency is changed, because the switching circuit is provided to select an optimum one of the plural delay lines having individually different delay times so that an effective signal time period of the inputted signal without delay time into the input terminal of the selected delay line is superimposed with a field through time period of the delayed signal reciprocally transmitted through the selected delay line and returned to the input terminal of the selected delay line.

It is preferable that the selector is connected between the plurality of delay lines and the node.

It is also preferable that the selector is connected between the plurality of delay lines and a ground line.

It is also preferable that the selector comprises a switching circuit.

Figure 4:
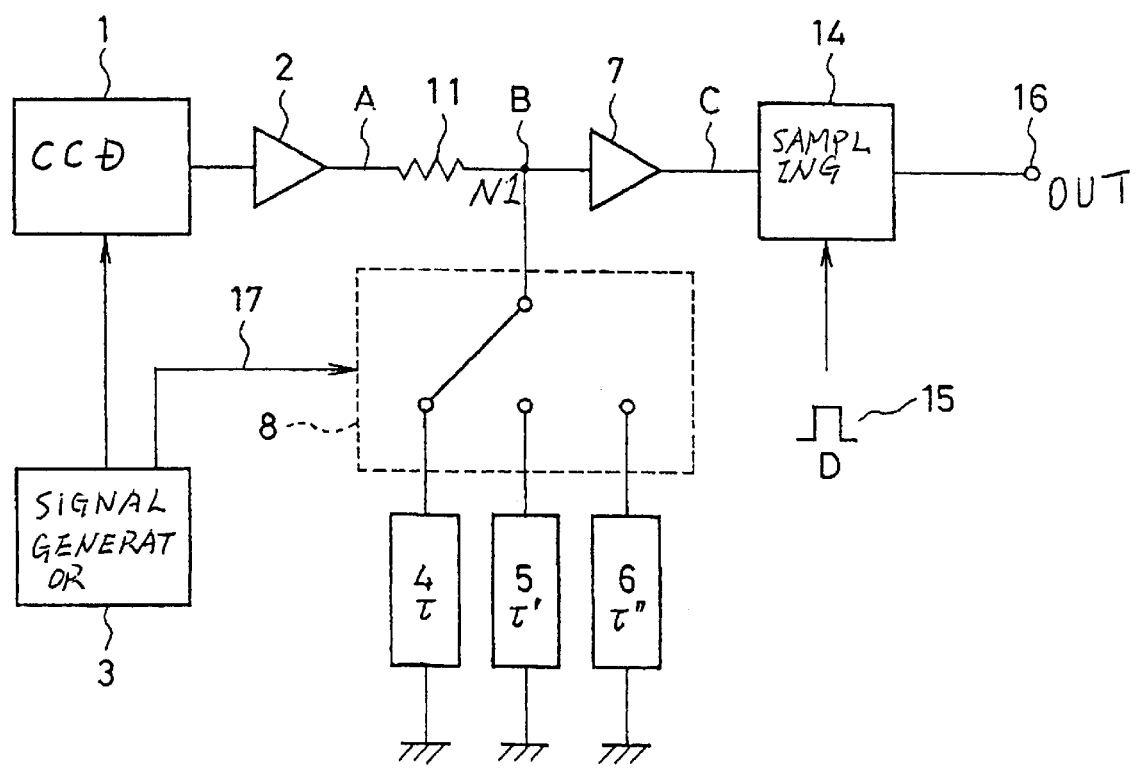
FIG. 4 is a circuit diagram illustrative of a first novel signal generator for a charge coupled device in a first embodiment in accordance with the present invention.

A first embodiment according to the present invention will be described in detail with reference to the drawings. FIG. 4 is a circuit diagram illustrative of a first novel signal generator for a charge coupled device in a first embodiment in accordance with the present invention. The first novel signal processor is connected to a charge coupled device 1. The first novel signal processor has a first buffer circuit 2 which has an input terminal connected to the charge coupled device 1. The first buffer circuit 2 has an output terminal from which a signal "A" is outputted. The first novel signal processor has a first resistance 11 connected between the output terminal of the first buffer circuit 2 and a first node N1. The first novel signal processor has a second buffer circuit 7 which has an input terminal connected through the first node N1 to the first resistance 11, so that a signal "B" is inputted into the input terminal of the second buffer circuit 7. The second buyer circuit 7 has an output terminal from which a signal "C" is outputted. The first novel signal processor has a sampling circuit 14 which is connected to the output terminal of the second buffer circuit 7. The sampling circuit 14 is connected to an output terminal 16. A pulse signal 15 is supplied to the sampling circuit 14. The first novel signal processor has a switching circuit 8 which has a fixing terminal as well as first, second and third terminals. The switching circuit 8 has three states. In the first state, the first terminal is connected to the fixing terminal so that the first node N1 is connected to the first terminal. In the second state, the second terminal is connected to the fixing terminal so that the first node N1 is connected to the second terminal. In the third state, the third terminal is connected to the fixing terminal so that the first node N1 is connected to the third terminal. The first novel signal processor has a first delay line 4 which is connected between the first terminal of the switching circuit 8 and a ground line, wherein the first delay line 4 provides the signal with a first delay time "τ". When the switching circuit 8 is in the first state, the first delay line 4 is connected through the switching circuit 8 to the first node N1. The first novel signal processor also has a second delay line 5 which is connected between the second terminal of the switching circuit 8 and a ground line, wherein the second delay line 5 provides the signal with a second delay time "τ'". When the switching circuit 8 is in the second state, the second delay line 5 is connected through the switching circuit 8 to the first node N1. The first novel signal processor also has a third delay line 6 which is connected between the third terminal of the switching circuit 8 and a ground line, wherein the third delay line 6 provides the signal with a third delay time "τ'"", When the switching circuit 8 is in the third state, the third delay line 6 is connected through the switching circuit 8 to the first node N1. The first novel signal processor also has a signal generator 3 which generates both one of different driving frequencies and a switching control signal in accordance with the generated one of the different driving frequencies. The driving frequency signal is supplied from the signal generator 3 to the charge coupled device 1. The switching control signal in accordance with the generated one of the different driving frequencies is supplied from the signal generator 3 to the switching circuit 8, so that the switching circuit 8 is switched in the three states as described above. The switching circuit 8 operates in accordance with the switching control signal to select one of the first, second and third delay lines 4, 5 and 6 having first, second and third delay times which are different from each other, so that an effective signal time period transmitted from the charge coupled device 1 through the first buffer circuit 2 and the first resistance and inputted into the input terminal of the selected delay line is superimposed over a field through time period of a delayed signal with a delay time provided in having transmitted on the selected delay line. The input signal is mixed with the delayed signal to generate an output signal which is then transmitted through the second buffer circuit 7 to the sampling circuit 14, for extracting an effective signal voltage from the supplied signal. The resistance 11 has an impedance which is equal to specific impedance of the first, second and third delay lines 4, 5 and 6.

It is possible as a modification to the switching circuit that the switching circuit is manually operable free from any switching control signal.

It is unnecessary to replace the delay line every time when the driving frequency is changed, because the switching circuit is provided to select an optimum one of the plural delay lines having individually different delay times so that an effective signal time period of the inputted. signal without delay time into the input terminal of the selected delay line is superimposed with a field through time period of the delayed signal reciprocally transmitted through the selected delay line and returned to the input terminal of the selected delay line.

Figure 5:
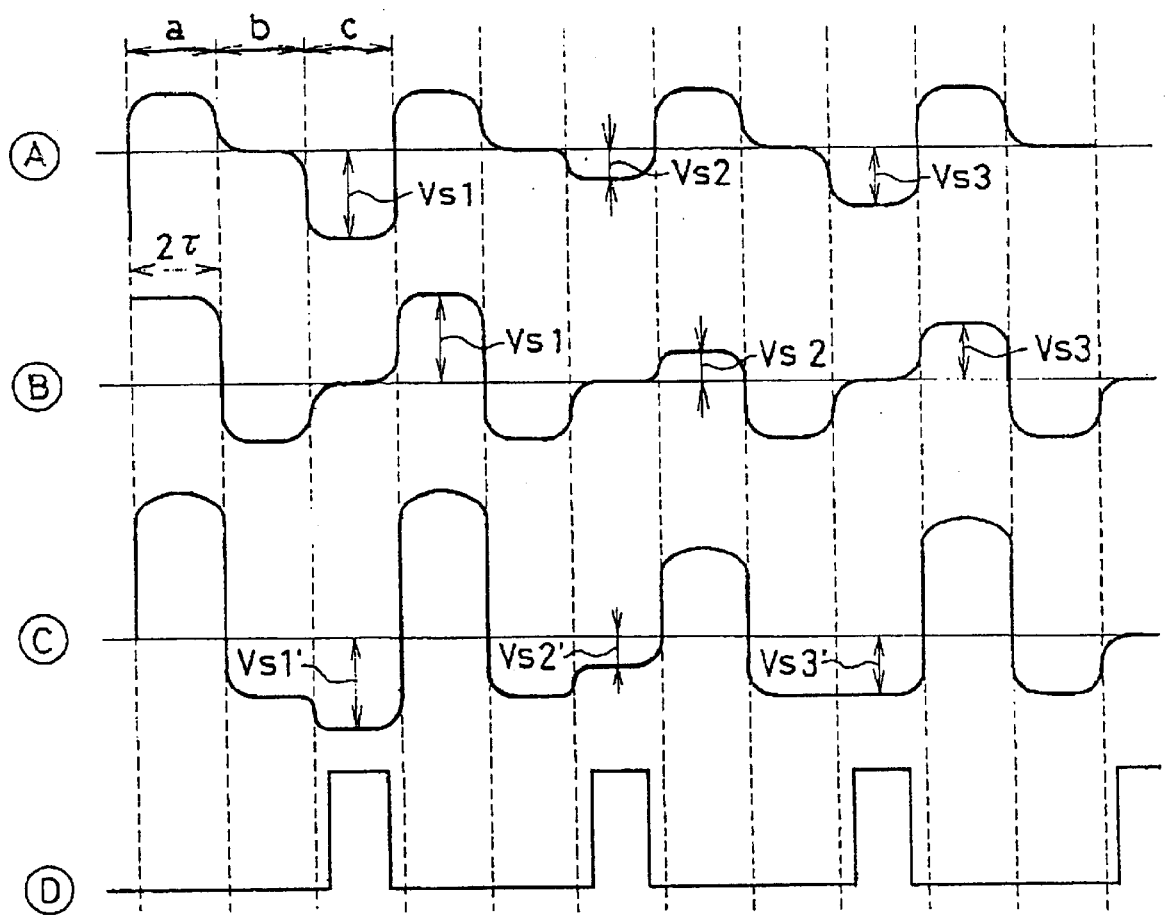
FIG. 5 is a diagram illustrative of a time chart for operations of the first novel circuit of FIG. 4.

FIG. 5 is a diagram illustrative of a time chart for operations of the first novel circuit of FIG. 4. The output signal waveform is cyclic. One cycle for pixel of the output signal from the charge coupled device may be classified or divided into three time periods. The first time period is a reset time period (a). The second time period is a field through time period (b). The third time period is a signal time period (c). An effective signal voltage level for one pixel appears to be potential differences Vs1, Vs2 and Vs3 between the field through time period (b) and the signal time period (c). The output signal (A) from the first buffer circuit 2 is transmitted through the first resistance 11 to the switching circuit 8. The signal generator 3 generates both one of different driving frequencies and a switching control signal 17 in accordance with the generated one of the different driving frequencies. The driving frequency signal is supplied from the signal generator 3 to the charge coupled device 1. The switching control signal 17 in accordance with the generated one of the different driving frequencies is supplied from the signal generator 3 to the switching circuit 8, so that the switching circuit 8 is operated to select optimum one of the first, second and third delay lines 4, 5, and 6 which have first, second and third delay times which are different from each other.

If the first delay line 4 having the first delay time "τ" is selected with reference to a first driving frequency f1, the output signal (A) is transmitted through the first delay line 4 and reaches the grounded output terminal with the first time delay τ and then inverted and reflected at the grounded output terminal. The delay signal returns to the input terminal from the output terminal of the first delay line 4 with the time delay τ. A total delay time of the delayed signal (B) is 2 τ. The output signal (A) transmitted through the first resistance 11 is mixed at the input terminal of the delay line 13 with the delayed signal (B) with the delay time 2 τ transmitted through the first delay line 4. The mixture of the output signal (A) with the delayed signal (B) makes an output signal (C). The output signal (C) is then transmitted through the second buffer circuit 7. For the output signal (C), the effective signal voltage is subjected to amplification-modulation and is represented to be the potential differences Vs1', Vs2' and Vs3'. The output signal "C" is transmitted to the sampling circuit 14 for extracting an effective signal voltage from the supplied signal.

If the second delay line 5 having the second delay time "τ'" is selected with reference to a second driving frequency f2, the output signal (A) is transmitted through the second delay line 5 and reaches the grounded output terminal with the second time delay τ' and then inverted and reflected at the grounded output terminal. The delay signal returns to the input terminal from the output terminal of the second delay line 5 with the second time delay τ'. A total delay time of the delayed signal (B) is 2 τ'. The output signal (A) transmitted through the first resistance 11 is mixed at the input terminal of the delay line 13 with the delayed signal (B) with the second delay time 2 τ' transmitted through the second delay line 5. The mixture of the output signal (A) with the delayed signal (B) makes an output signal (C). The output signal (C) is then transmitted through the second buffer circuit 7. For the output signal (C), the effective signal voltage is subjected to amplification-modulation and is represented to be the potential differences Vs1', Vs2' and Vs3'. The output signal "C" is transmitted to the sampling circuit 14 for extracting an effective signal voltage from the supplied signal.

If the third delay line 6 having the third delay time "τ''" is selected with reference to a third driving frequency f3, the output signal (A) is transmitted through the third delay line 6 and reaches the grounded output terminal with the third time delay τ'' and then inverted and reflected at the grounded output terminal. The delay signal returns to the input terminal from the output terminal of the third delay line 6 with the third time delay τ''. A total delay time of the delayed signal (B) is 2 τ''. The output signal (A) transmitted through the first resistance 11 is mixed at the input terminal of the delay line 13 with the delayed signal (B) with the third delay time 2 τ'' transmitted through the third delay line 6. The mixture of the output signal (A) with the delayed signal (B) makes an output signal (C). The output signal (C) is then transmitted through the second buffer circuit 7. For the output signal (C), the effective signal voltage is subjected to amplification-modulation and is represented to be the potential differences Vs1', Vs2' and Vs3'. The output signal "C" is transmitted to the sampling circuit 14 for extracting an effective signal voltage from the supplied signal.

It is unnecessary to replace the delay line every time when the driving frequency is changed, because the switching circuit is provided to select an optimum one of the plural delay lines having individually different delay times so that an effective signal time period of the inputted signal without delay time into the input terminal of the selected delay line is superimposed with a field through time period of the delayed signal reciprocally transmitted through the selected delay line and returned to the input terminal of the selected delay line.

Figure 6:
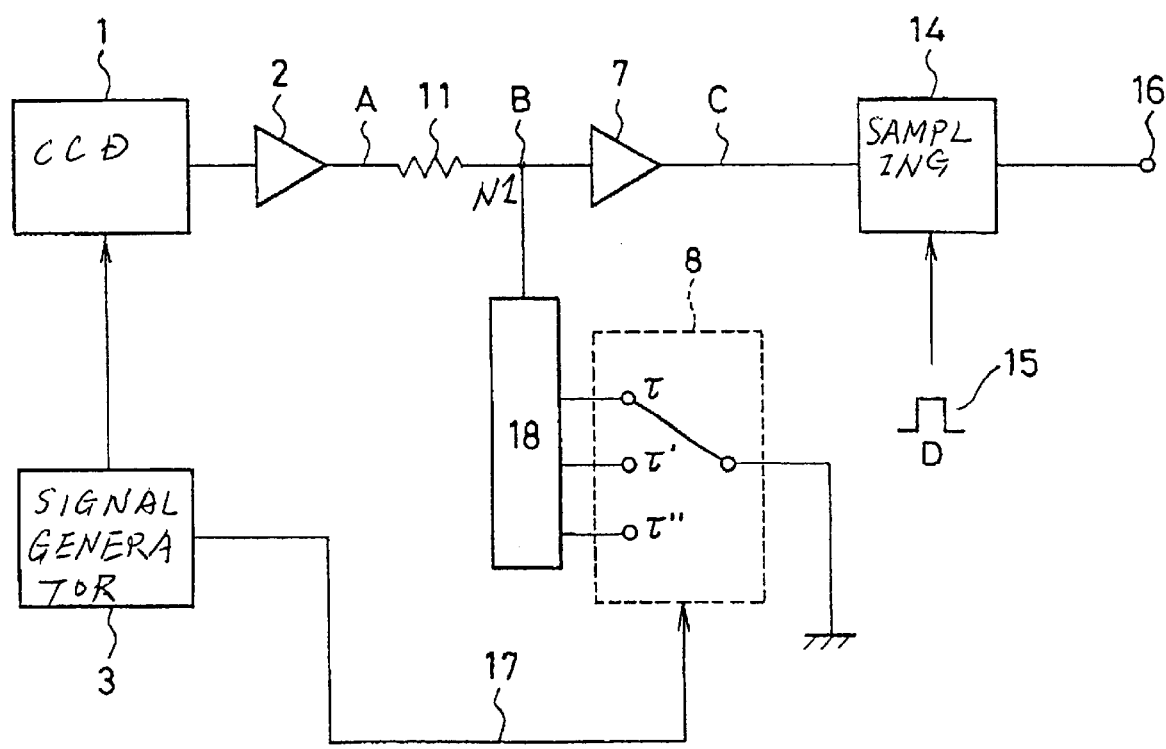
FIG. 6 is a circuit diagram illustrative of a first novel signal generator for a charge coupled device in a second embodiment in accordance with the present invention.

A second embodiment according to the present invention will be described in detail with reference to the drawings. FIG. 6 is a circuit diagram illustrative of a first novel signal generator for a charge coupled device in a second embodiment in accordance with the present invention The first novel signal processor is connected to a charge coupled device 1. The first novel signal processor has a first buffer circuit 2 which has an input terminal connected to the charge coupled device 1. The first buffer circuit 2 has an output terminal from which a signal "A" is outputted. The first novel signal processor has a first resistance 11 connected between the output terminal of the first buffer circuit 2 and a first node N1. The first novel signal processor has a second buffer circuit 7 which has an input terminal connected through the first node N1 to the first resistance 11, so that a signal "B" is inputted into the input terminal of the second buffer circuit 7. The second buffer circuit 7 has an output terminal from which a signal "C" is outputted. The first novel signal processor has a sampling circuit 14 which is connected to the output terminal of the second buffer circuit 7. The sampling circuit 14 is connected to an output terminal 16. A pulse signal 15 is supplied to the sampling circuit 14. The first novel signal processor has three delay lines 18 which are connected to the node "N1". The first novel signal processor has a switching circuit 8 which has a fixing terminal grounded as well as first, second and third terminals which are connected to the delay lines 18. The switching circuit 8 has three states. In the first state, the first terminal is connected to the fixing terminal so that the first node N1 is connected through the delay line 18 to the first terminal. In the second state, the second terminal is connected to the fixing terminal so that the first node N1 is connected through the delay line 18 to the second terminal. In the third state, the third terminal is connected to the fixing terminal so that the first node N1 is connected through the delay line 18 to the third terminal. The three delay lines 18 are connected between the first node "N1" and the first, second and third terminals of the switching circuit 8, wherein the first delay line provides the signal with a first delay time "τ". When the switching circuit 8 is in the first state, the first delay line is connected through the switching circuit 8 to the ground line. The second delay line is connected between the second terminal of the switching circuit 8 and the first node "N1", wherein the second delay line provides the signal with a second delay time "τ'". When the switching circuit 8 is in the second state, the second delay line is connected through the switching circuit 8 to the ground line. The third delay line is connected between the third terminal of the switching circuit 8 and the first node "N1", wherein the third delay line 6 provides the signal with a third delay time "τ''". When the switching circuit 8 is in the third state, the third delay line 6 is connected through the switching circuit 8 to the ground line. The first novel signal processor also has a signal generator 3 which generates both one of different driving frequencies and a switching control signal 17 in accordance with the generated one of the different driving frequencies. The driving frequency signal is supplied from the signal generator 3 to the charge coupled device 1. The switching control signal 17 in accordance with the generated one of the different driving frequencies is supplied from the signal generator 3 to the switching circuit 8, so that the switching circuit 8 is switched in the three states as described above. The switching circuit 8 operates in accordance with the switching control signal 17 to select one of the first, second and third delay lines 18 having first, second and third delay times which are different from each other, so that an effective signal time period transmitted from the charge coupled device 1 through the first buer circuit 2 and the first resistance and inputted into the input terminal of the selected delay line is superimposed over a field through time period of a delayed signal with a delay time provided in having transmitted on the selected delay line. The input signal is mixed with the delayed signal to generate an output signal which is then transmitted through the second buffer circuit 7 to the sampling circuit 14, for extracting an effective signal voltage from the supplied signal. The resistance 11 has an impedance which is equal to specific impedance of the first, second and third delay lines 18.

It is possible as a modification to the switching circuit that the switching circuit is manually operable free from any switching control signal.

It is unnecessary to replace the delay line every time when the driving frequency is changed, because the switching circuit is provided to select an optimum one of the plural delay lines having individually different delay times so that an effective signal time period of the inputted signal without delay time into the input terminal of the selected delay line is superimposed with a field through time period of the delayed signal reciprocally transmitted through the selected delay line and returned to the input terminal of the selected delay line.

Figure 7:
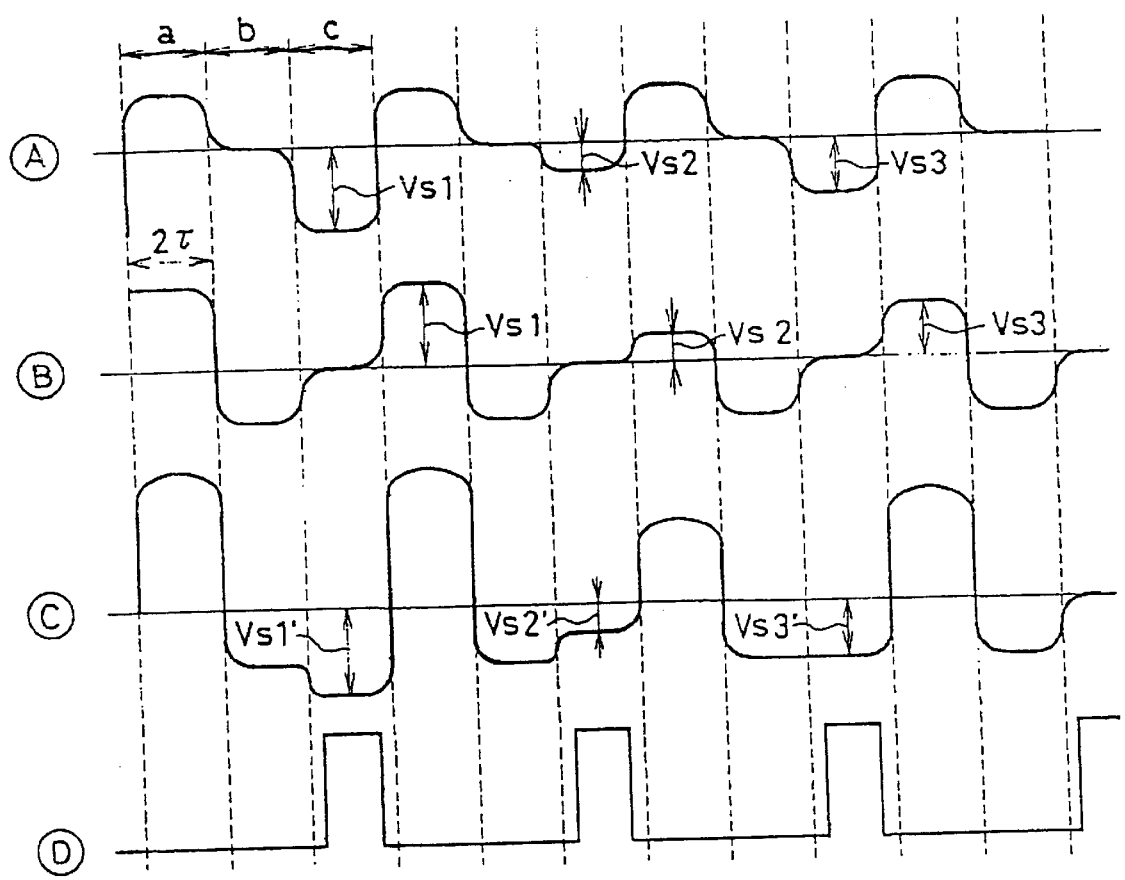
FIG. 7 is a diagram illustrative of a time chart for operations of the first novel circuit of FIG. 6.

FIG. 7 is a diagram illustrative of a time chart for operations of the first novel circuit of FIG. 6. The output signal waveform is cyclic. One cycle for pixel of the output signal from the charge coupled device may be classified or divided into three time periods. The first time period is a reset time period (a). The second time period is a field through time period (b). The third time period is a signal time period (c). An effective signal voltage level for one pixel appears to be potential differences Vs1, Vs2 and Vs3 between the field through time period (b) and the signal time period (c). The output signal (A) from the first buffer circuit 2 is transmitted through the first resistance 11 to the switching circuit 8. The signal generator 3 generates both one of different driving frequencies and a switching control signal 17 in accordance with the generated one of the different driving frequencies. The driving frequency signal is supplied from the signal generator 3 to the charge coupled device 1. The switching control signal 17 in accordance with the generated one of the different driving frequencies is supplied from the signal generator 3 to the switching circuit 8, so that the switching circuit 8 is operated to select optimum one of the first, second and third delay lines 18 which have first, second and third delay times which are different from each other, If the first delay line having the first delay time "τ" is selected with reference to a first driving frequency f1, the output signal (A) is transmitted through the first delay line and reaches the grounded output terminal with the first time delay τ and then inverted and reflected at the grounded output terminal. The delay signal returns to the input terminal from the output terminal of the first delay line with the time delay τ. A total delay time of the delayed signal (B) is 2 τ. The output signal (A) transmitted through the first resistance 11 is mixed at the input terminal of the delay line 18 with the delayed signal (B) with the delay time 2 τ transmitted through the first delay line 4. The mixture of the output signal (A) with the delayed signal (B) makes an output signal (C). The output signal (C) is then transmitted through the second buffer circuit 7. For the output signal (C), the effective signal voltage is subjected to amplification-modulation and is represented to be the potential differences Vs1', Vs2' and Vs3'. The output signal "C" is transmitted to the sampling circuit 14 for extracting an effective signal voltage from the supplied signal.

If the second delay line having the second delay time "τ'" is selected with reference to a second driving frequency f2, the output signal (A) is transmitted through the second delay line and reaches the grounded output terminal with the second time delay τ' and then inverted and reflected at the grounded output terminal. The delay signal returns to the input terminal from the output terminal of the second delay line with the second time delay τ'. A total delay time of the delayed signal (B) is 2 τ'. The output signal (A) transmitted through the first resistance 11 is mixed at the input terminal of the delay line 13 with the delayed signal (B) with the second delay time 2 τ' transmitted through the second delay line. The mixture of the output signal (A) with the delayed signal (B) makes an output signal (C). The output signal (C) is then transmitted through the second buffer circuit 7. For the output signal (C), the effective signal voltage is subjected to amplification-modulation and is represented to be the potential differences Vs1', Vs2' and Vs3'. The output signal "C" is transmitted to the sampling circuit 14 for extracting an effective signal voltage from the supplied signal.

If the third delay line having the third delay time "τ''" is selected with reference to a third driving frequency f3, the output signal (A) is transmitted through the third delay line and reaches the grounded output terminal with the third time delay τ'' and then inverted and reflected at the grounded output terminal. The delay signal returns to the input terminal from the output terminal of the third delay line with the third time delay τ''. A total delay time of the delayed signal (B) is 2 τ''. The output signal (A) transmitted through the first resistance 11 is mixed at the input terminal of the delay line 13 with the delayed signal (B) with the third delay time 2 τ'' transmitted through the third delay line 6. The mixture of the output signal (A) with the delayed signal (B) makes an output signal (C). The output signal (C) is then transmitted through the second buffer circuit 7. For the output signal (C), the effective signal voltage is subjected to amplification-modulation and is represented to be the potential differences Vs1', Vs2' and Vs3'. The output signal "C" is transmitted to the sampling circuit 14 for extracting an effective signal voltage from the supplied signal.

It is unnecessary to replace the delay line every time when the driving frequency is changed, because the switching circuit is provided to select an optimum one of the plural delay lines having individually different delay times so that an effective signal time period of the inputted signal without delay time into the input terminal of the selected delay line is superimposed with a field through time period of the delayed signal reciprocally transmitted through the selected delay line and returned to the input terminal of the selected delay line.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A signal processor connected to a charge-coupled device, said signal processor having:
   a plurality of delay lines connected to a node on a signal line extending from said charge-coupled device to an output terminal of said signal processor, said delay lines having individually different delay times;
   a selector connected to said plurality of delay lines for selecting an optimum one of said plurality of delay lines, so that an effective signal time period of a time delay free inputted signal into an input terminal of a selected one of said delay lines is superimposed with a field through time period of a delayed signal reciprocally transmitted through said selected one of said delay lines and returned to said input terminal of said selected one of said delay lines; and
   a signal generator connected to said charge-coupled device for generating both one of plural driving frequencies to be transmitted to said charge-coupled device and a selecting control signal to be transmitted to said selector, so that said selector is operated to select an optimum one of said plurality of delay lines in accordance with said received selecting control signal.

2. A signal processor connected to a charge-coupled device, said signal processor having:
   a signal generator being connected to said charge-coupled device for generating both one of plural driving frequencies to be transmitted to said charge-coupled device and a selecting control signal;
   a plurality of delay lines being connected to a node on a signal line extending from said charge-coupled device to an output terminal of said signal processor, said delay lines having individually different delay times; and
   a selector being connected to said plurality of delay lines and also connected to said signal generator for receiving said selecting control signal as so as to select an optimum one of said plurality of delay lines in accordance with said received selecting control signal, so that an effective signal time period of a time delay free inputted signal into an input teyrninal of a selected one of said delay lines is superimposed with a field through time period of a delayed signal reciprocally transmitted through said selected one of said delay lines and returned to said input terminal of said selected one of said delay lines.

3. The signal processor as claimed in claim 2, wherein said selector is connected between said plurality of delay lines and said node.

4. The signal processor as claimed in claim 2, wherein said selector is connected between said plurality of delay lines and a ground line.

5. The signal processor as claimed in claim 2, wherein said selector comprises a switching circuit.

* * * * *